US008252517B2

(12) United States Patent
Thomas et al.

(10) Patent No.: US 8,252,517 B2
(45) Date of Patent: Aug. 28, 2012

(54) STOP FLOW INTERFERENCE LITHOGRAPHY SYSTEM

(75) Inventors: Edwin L. Thomas, Natick, MA (US); Patrick Seamus Doyle, Boston, MA (US); Dhananjay Dendukuri, Begumpet (IN); Ji-Hyun Jang, Cambridge, MA (US); Chaitanya K. Ullal, Goettingen (DE)

(73) Assignee: Massachusetts Institute of Technology, Cambridge, MA (US)

( * ) Notice: Subject to any disclaimer, the term of this patent is extended or adjusted under 35 U.S.C. 154(b) by 587 days.

(21) Appl. No.: 12/503,935

(22) Filed: Jul. 16, 2009

(65) Prior Publication Data
US 2010/0099048 A1    Apr. 22, 2010

Related U.S. Application Data

(60) Provisional application No. 61/081,864, filed on Jul. 18, 2008.

(51) Int. Cl.
G03F 7/20 (2006.01)
(52) U.S. Cl. .......... 430/320; 430/396; 430/945; 355/67; 355/71
(58) Field of Classification Search .................. None
See application file for complete search history.

(56) References Cited

U.S. PATENT DOCUMENTS

| 6,488,872 | B1 | 12/2002 | Beebe et al. | |
|---|---|---|---|---|
| 2003/0201022 | A1* | 10/2003 | Kawai et al. | 137/828 |
| 2005/0043428 | A1 | 2/2005 | Caneba et al. | |
| 2006/0228386 | A1 | 10/2006 | Stephens et al. | |
| 2006/0286488 | A1* | 12/2006 | Rogers et al. | 430/325 |
| 2007/0054119 | A1 | 3/2007 | Garstecki et al. | |
| 2007/0105972 | A1 | 5/2007 | Doyle et al. | |
| 2008/0176216 | A1* | 7/2008 | Doyle et al. | 435/5 |

FOREIGN PATENT DOCUMENTS

EP    0 978 738 A1 * 2/2000

OTHER PUBLICATIONS

International Search Report and Written Opinion, PCT/US2009/061474, Oct. 21, 2009, pp. 1-11.

* cited by examiner

Primary Examiner — John A. McPherson
(74) Attorney, Agent, or Firm — Evans & Molinelli PLLC; Eugene J. Molinelli

(57) ABSTRACT

Stop flow interference lithography system for high throughput synthesis of 3-dimensionally patterned polymer particles. The system includes a microfluidic channel containing a stationary oligomer film and a phase mask located adjacent to the microfluidic channel. A source of collimated light is provided for passing the collimated light through the phase mask and into the microfluidic channel for interaction with the oligomer. The passage of the collimated light through the phase mask generates a 3-dimensional distribution of light intensity to induce crosslinking of the oligomer in high intensity regions thereby forming 3-dimensional structures.

20 Claims, 11 Drawing Sheets

DIC image of microfluidic channel

Optical microscope images of Janus particles

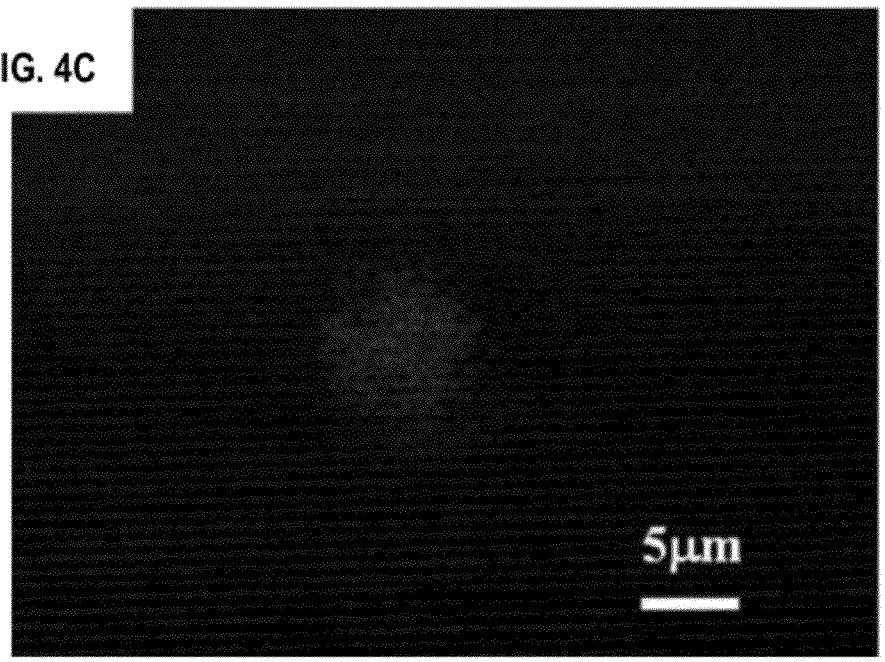
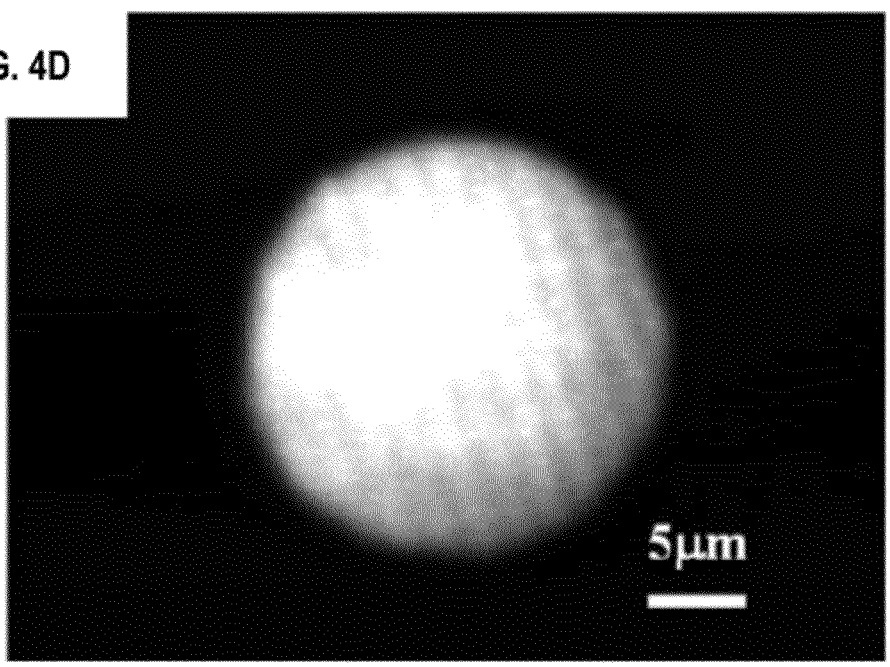

SEQUENCE LISTING

<160> NUMBER OF SEQ ID NOS: 2

<210> SEQ ID NO 1
<211> LENGTH: 20

-continued

```
<212> TYPE: DNA
<213> ORGANISM: Artificial Sequence
<220> FEATURE:
<223> OTHER INFORMATION: Synthetic oligomer probe
<220> FEATURE:
<221> NAME/KEY: misc_feature
<222> LOCATION: (1)..(1)
<223> OTHER INFORMATION: 5' end modified with reactive Acrydite group
      and 18 carbon spacer

<400> SEQUENCE: 1
atagcagatc agcagccaga                                              20

<210> SEQ ID NO 2
<211> LENGTH: 20
<212> TYPE: DNA
<213> ORGANISM: Artificial Sequence
<220> FEATURE:
<223> OTHER INFORMATION: Synthetic oligomer probe
<220> FEATURE:
<221> NAME/KEY: misc_feature
<222> LOCATION: (1)..(1)
<223> OTHER INFORMATION: 5' end is modified with a reactive Acrydite
      group and 18-carbon spacer

<400> SEQUENCE: 2
cactatgcgc aggttctcat                                              20
```

STOP FLOW INTERFERENCE LITHOGRAPHY SYSTEM

This application claims priority to U.S. provisional patent application Ser. No. 61/081,864 filed on Jul. 18, 2008, the contents of which are incorporated herein by reference in their entirety.

This invention arose from research supported by the U.S. Army Research Office under grant numbers W911NF-07-D-0004 and DAAD-19-02-D-0002. The government has certain rights in this invention.

BACKGROUND OF THE INVENTION

This invention relates to a stop flow interference lithography system and more particularly to such a system for the high throughput synthesis of 3-dimensionally patterned polymeric particles.

Polymeric structures with repeating 2-dimensional (2D) and 3D motifs at the micron scale and below have a variety of uses. Patterned 2D structures have been shown to have myriad applications in biosensors,[1] tissue engineering,[2] and diagnostic assay systems.[3] The numbers in brackets refer to the references included herein. The contents of all of these references are incorporated herein by reference. The availability of more sophisticated 3D structures would enable important advances in photonics,[4] information storage,[5] and tissue engineering.[6,7] Many techniques have been developed to fabricate complex 3D structures at the micron scale and below using either top-down or bottom-up approaches. Bottom-up approaches like polymer phase separation,[8] molecular self-assembly,[9] or colloidal assembly[10] are cheap and can cover large areas but face problems of defects and limitations in the type and the geometry of structures that can be formed. While top-down methods offer precise size and shape control, the need to construct the 3D structures using either a point-by-point or layer-by-layer process makes such methods as gray-scale photolithography,[11] direct 3D writing,[12] or 2-photon lithography[13] very time consuming.

Recently, Interference Lithography (IL)[14-20] has emerged as an attractive alternative technique, that allows one to rationally design complex and defect-free 1D, 2D and 3D patterns over large areas. Besides being fast and efficient, IL also affords control over geometrical parameters, such as symmetry and volume fractions, of the structures formed. IL performed using an elastomeric PDMS phase mask[17] has the further advantage of providing simple and inexpensive processing, since only a single collimated beam is needed to form 3D interference patterns. However, phase mask interference lithography (PMIL)[16,17] is typically performed by flood exposing a spin-coated layer of photoresist film through a phase mask, thus imposing some restrictions on the shape and material properties of the structures formed as well as limiting the throughput because of the serial nature of the processing. Furthermore, such processes are not easily amenable to the fabrication of structures that possess chemical anisotropy. Chemical anisotropy refers to the presence of multiple, segregated chemical functionalities or gradients of one or more chemical functionality in a structure. The synthesis of structures that possess controllable material properties and texturing across multiple length scales is important for a variety of applications such as tissue engineering[2], self-assembly[21] or particle diagnostics.[3] To address this challenge, several microfluidic techniques that combine traditional photopolymerization or lithography with the unique properties of flow at the micron scale have emerged recently.[22,23] The Doyle group developed a simple, flow-through microfluidic process called Stop Flow Lithography (SFL)[24] that enables photolithography to be performed in a flowing stream of oligomer. This enables the high throughput synthesis of large numbers of micron-sized particles in any 2D extruded shape using a variety of polymer precursors.[24] The method also provides the ability to finely and conveniently tune the chemical anisotropy of the structures formed. However, to date, the use of transparency masks has restricted the method to the formation of only solid 2D shapes with relatively large feature sizes.[22,25]

SUMMARY OF THE INVENTION

The stop flow interference lithography (SFIL) system for high throughput synthesis of 3-dimensionally patterned polymeric particles according to the invention includes a microfluidic channel containing a stationary oligomer. A phase mask is located adjacent to the microfluidic channel. A source of collimated light passes the collimated light through the phase mask and into the microfluidic channel for interaction with the oligomer. The passage of the collimated light through the phase mask generates a 3-dimensional distribution of light intensity that induces crosslinking of the oligomer in high intensity regions of the light thereby forming the 3-dimensional structures.

In preferred embodiments, the light source is a pulsed laser or a mercury lamp. A transparency mask for transmitting light from the light source to define the 2-dimensional shape of the particles may also be utilized. It is preferred that the oligomer includes a photoinitiator. Light from the light source may be controlled by a shutter. It is also preferred that a protective layer be provided between the phase mask and liquid oligomer. A radical inhibitor may also be provided in the oligomer to compensate a non-zero background of the interference intensity. The 3-dimensionally patterned particles may possess chemical anisotropy.

The novel microfluidic SFIL system disclosed herein thus integrates the complementary aspects of phase mask interference lithography with stop flow lithography. The system of the invention enables the high throughput synthesis of 3-dimensionally patterned, transparency mask-defined polymeric particles having submicron feature sizes using liquid, biocompatible, oligomer precursors. Improved throughput results from the ability to repeatedly form and flow out arrays of structured particles in under a second. This improvement results from oxygen-induced inhibition[26] of free radical polymerization reactions at PDMS surfaces as explained in an earlier work.[22] Material advantages result from the fact that even freely flowing oligomer liquids of low viscosity can be patterned in a continuous fashion without the requirement that they be spin-coated, exposed and developed in a step-by-step fashion. The properties of the structures formed using the system disclosed herein can be finely tuned by varying light intensity, and photoinitiator and inhibitor concentrations. Chemical anisotropy is introduced by exploiting the laminar co-flow of liquids in the microfluidic device that results from the dominance of diffusive over convective transport.[27]

BRIEF DESCRIPTION OF THE DRAWING

FIG. 4c is an image of the region highlighted in FIG. 4a taken using a fluorescence microscope.

FIG. 4d is a fluorescent image of the structure seen in FIG. 4b showing a high signal value.

DESCRIPTION OF THE PREFERRED EMBODIMENT

Figure 1A:
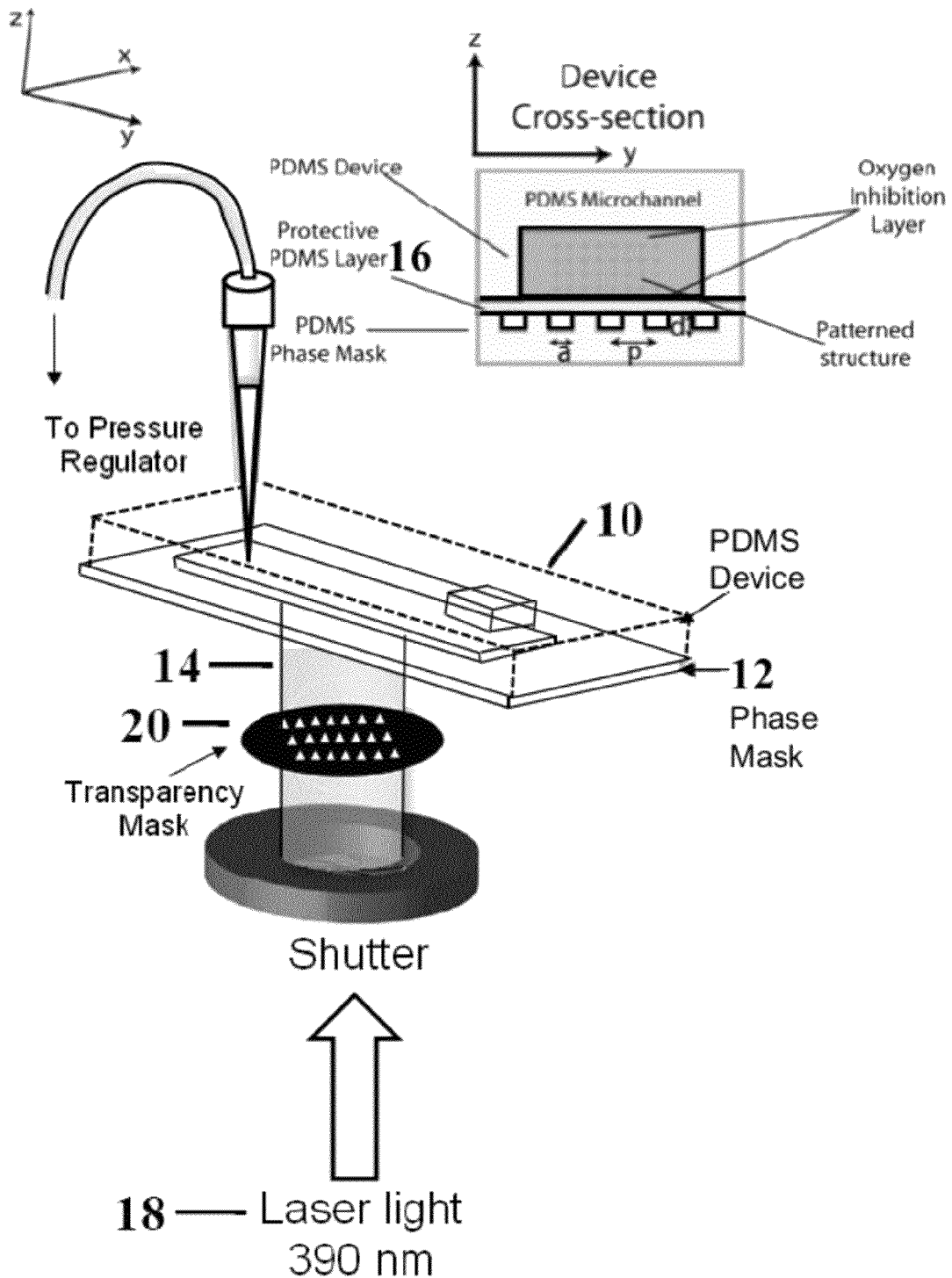
FIG. 1a is a schematic illustration of an embodiment of the invention disclosed herein.
Figure 1B:
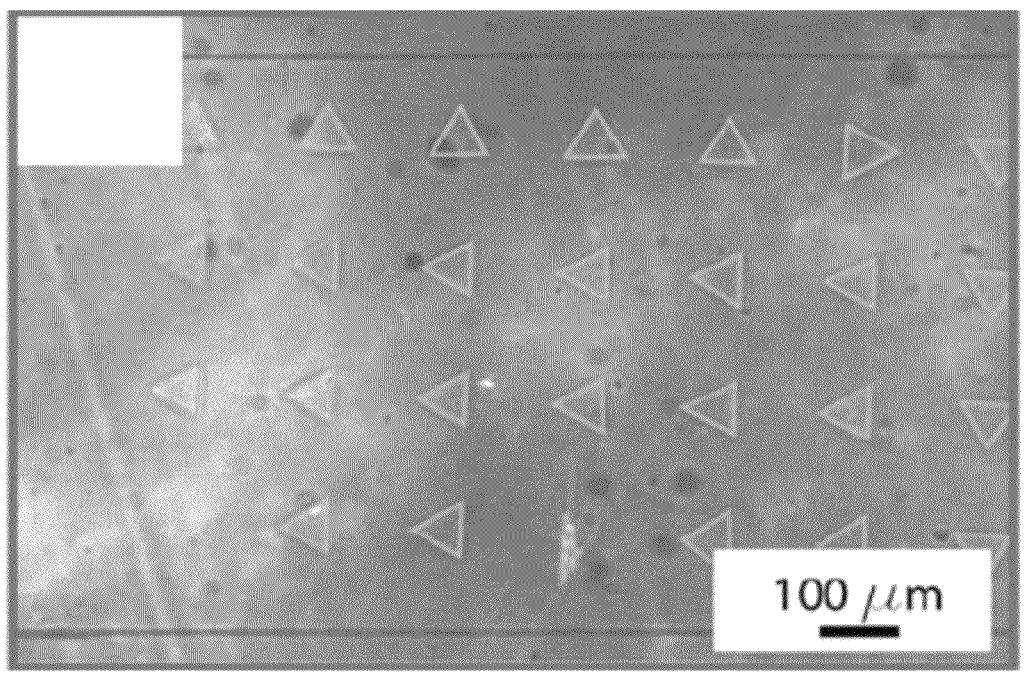
FIG. 1b is a brightfield image of an array of patterned triangles of side 60 μm formed in a 600 μm wide, 30 μm tall, microfluidic device.
Figure 1C:
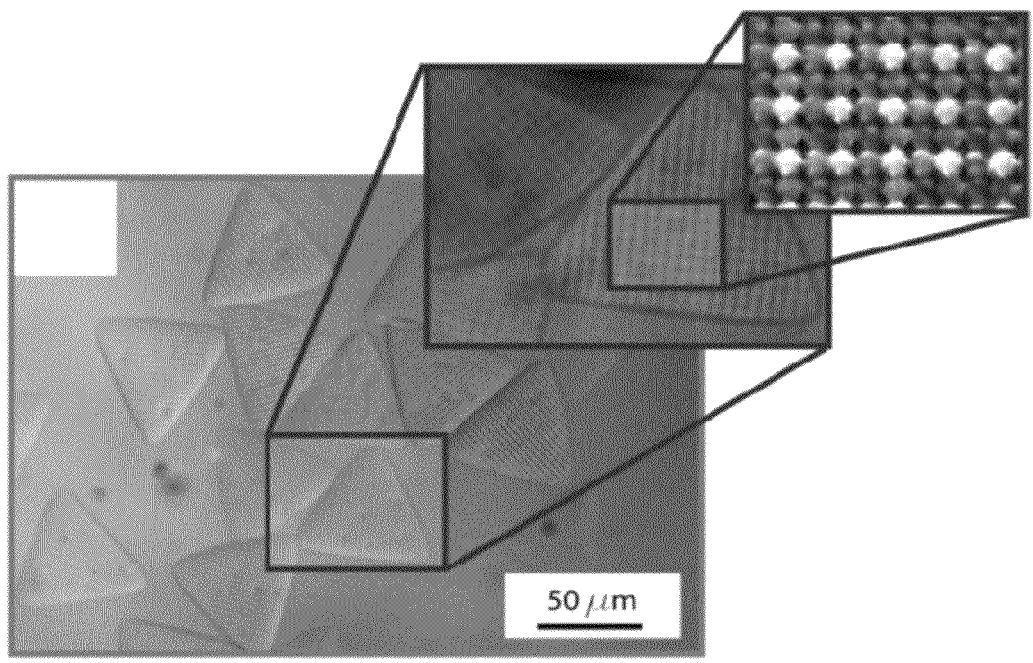
FIG. 1c is a set of differential interference contrast (DIC) and SEM images of the triangles shown in FIG. 1b after they have been suspended in ethanol.

A schematic diagram of the setup used for SFIL is shown in FIG. 1. The microfluidic device 10 and a phase mask 12, both molded in PDMS, are sealed to each other as shown in the cross-sectional view in FIG. 1a. The passage of collimated light 14 through the phase mask 12 results in the generation of a complex 3-dimensional distribution of light intensity. This induces crosslinking of the oligomer only in the high intensity regions leading to the formation of a 3D structure. A protective, 3 μm thick, PDMS layer 16 is laminated (as by spin-coating) on top of the phase mask 12 in order to prevent the liquid oligomer from filling up the interstitial spaces in the phase mask 12 that provide the refractive index difference required when light traverses through the phase mask. We have used microfluidic devices with a lateral dimension of 1-5 mm to synthesize both millimeter-sized structures as well as arrays of micron-sized particles. The integrated device is placed on a microscope stage and collimated light is provided either from a laser 18 or by the passage of unfocused UV light from a Hg lamp (not shown) through a blackened, hollow metallic tube. A mask 20 containing the shape of the desired structure is placed in the field stop of the microscope or in the path of the laser to define the 2D shape of the particles. Liquid Poly(ethylene glycol diacrylate) (PEGDA) oligomer containing photoinitiator flows through the microfluidic device 10 as described in the experimental section below. PEG-based hydrogel polymers, with their minimization of non-specific binding, are well suited for use in biological applications. Here we illustrate the method by forming PEGDA equilateral triangular prisms with a side of 60 μm and a thickness of 25 μm having a 3D structure using a phase mask that has a square 2 μm periodic surface pattern. Posts in the phase mask 12 have a depth of 1 μm and a spacing of 2 μm (d=1 μm and p=2 μm). The particles are formed in a stationary layer of oligomer using an exposure time of 300 ms and then flushed out into a reservoir. Differential Interference Contrast (DIC) images of the structures right after they are formed in the channel are shown in FIG. 1b. In FIG. 1c, we show DIC images of the particles from FIG. 1b after they have been suspended in ethanol. The phase mask-induced pattern is clearly visible in the close-up DIC and SEM images of the triangular shaped particles shown in the inset of FIG. 1c. These monodisperse, 60 μm particles were synthesized at a rate of 10,000 per hour.

Figure 2A:
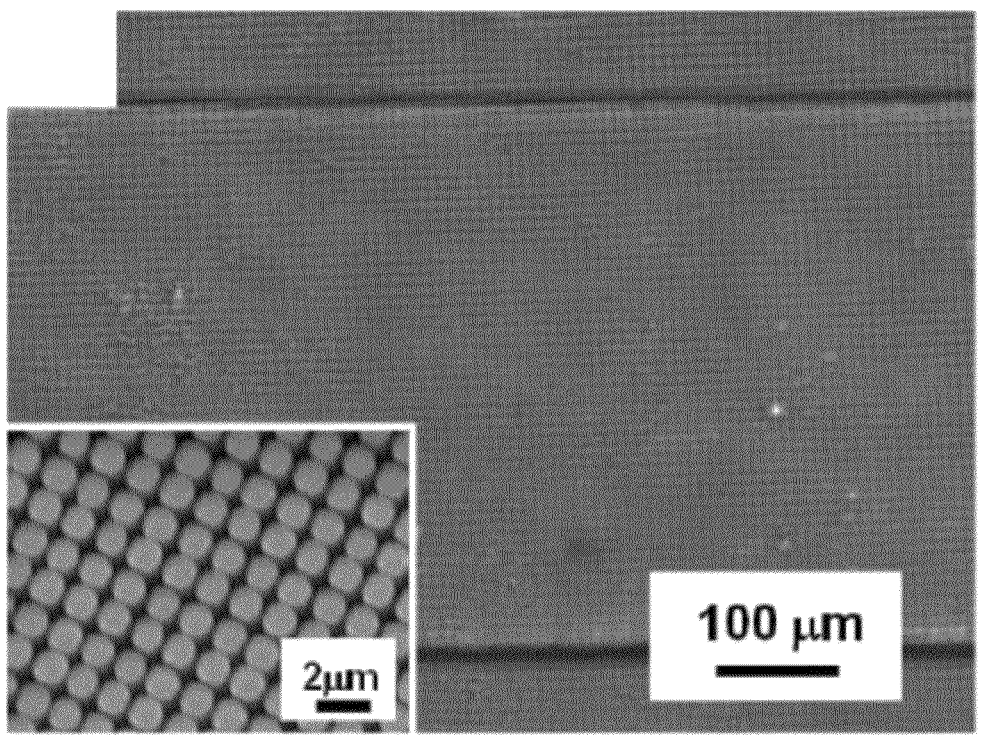
FIG. 2a is an optical microscope image of a microfluidic channel viewed through a phase mask. The inset is an SEM image of the phase mask.
Figure 2B:
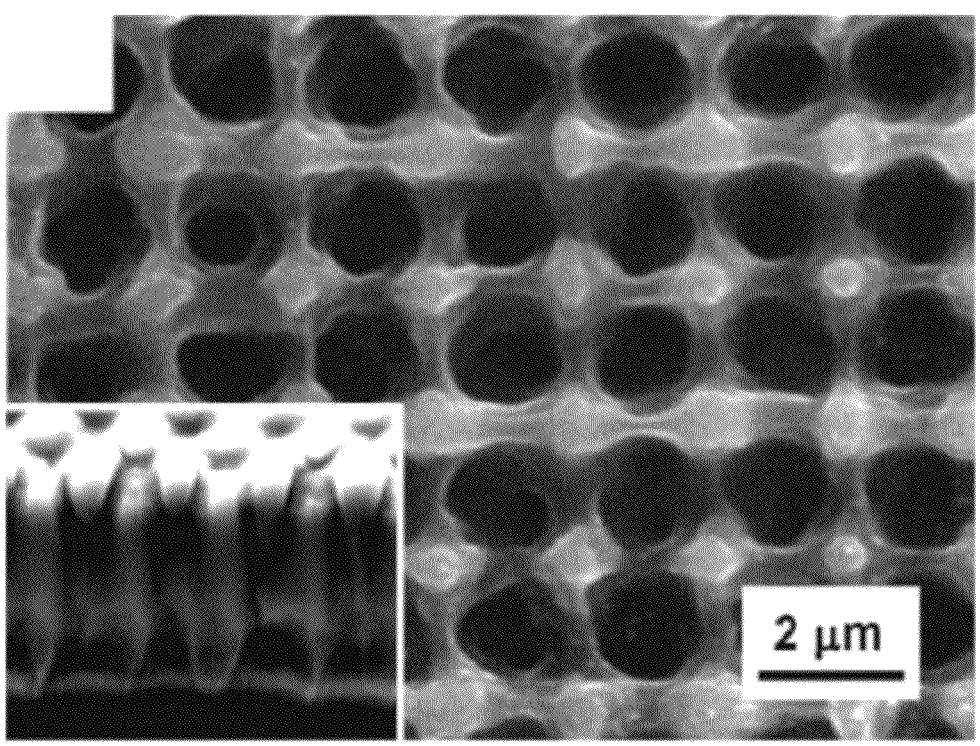
FIG. 2b is an SEM image of PEGDA structure fabricated in a microfluidic channel. The inset is a cross-sectional view of the structure.
Figure 2C:
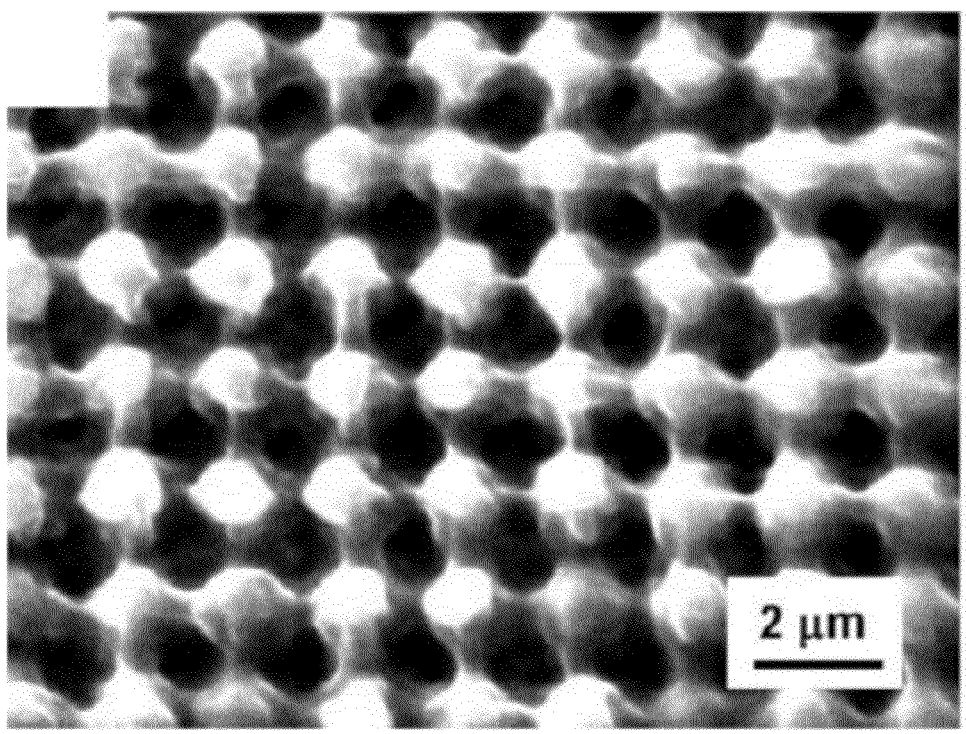
FIG. 2c is an SEM image of PEGDA fabricated at a longer exposure time and with a lower amount of inhibitor.
Figure 2D:
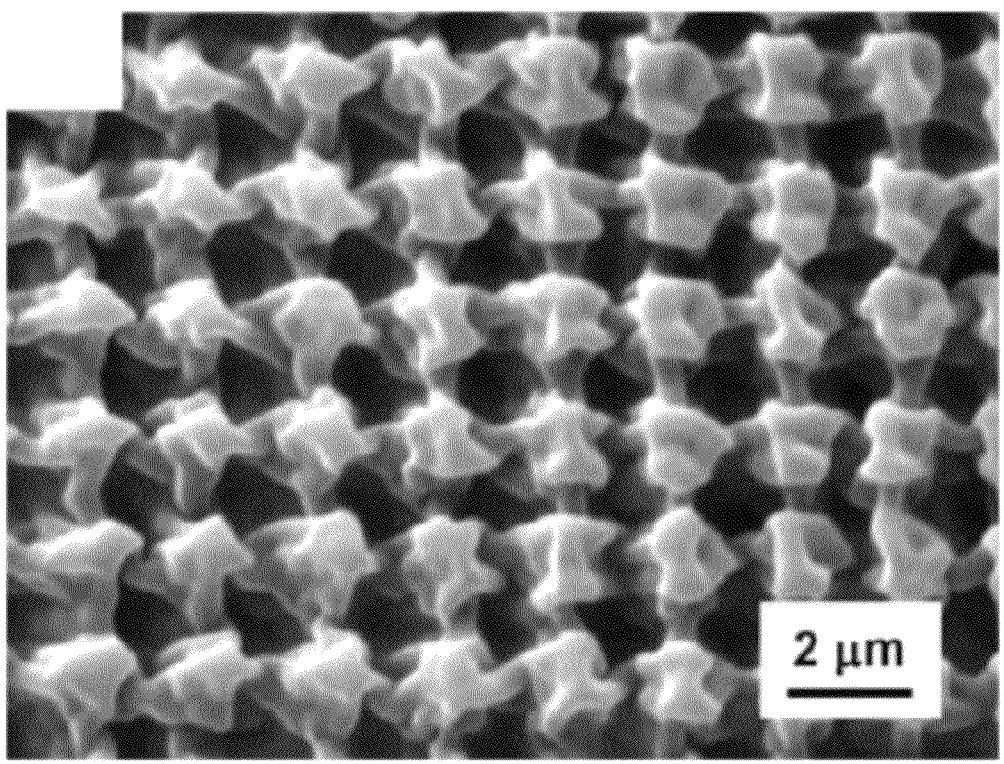
FIG. 2d is an SEM image of a shrunken PEGDA structure with resultant flower-shapes.

SEM images of the typical structures formed by SFIL are shown in FIGS. 2a-2d. An image of the microfluidic device 10 integrated with the phase mask 12 and the SEM image of the particular phase mask used to synthesize the structures are shown in FIG. 2a. To minimize an inherent DC offset of the light intensity and to better control the propagation of radical transfer, we added a small amount of radical inhibitor (hydroquinone).[28] By controlling light intensity and concentration of inhibitor, structures with different surface morphologies and volume fractions are formed from the same phase mask as shown in FIGS. 2b, 2c, and 2d. FIG. 2b is obtained at low exposure time (700 ms) and high amount of inhibitor (1.2 wt % of hydroquinone). The inset is the cross-sectional view of the structure[29] 3D structures with higher volume fraction than FIG. 2b are formed under other conditions (e.g. longer exposure time (1000 ms) and low amount of inhibitor (0.3 wt % of hydroquinone)) which lead to higher crosslinking density (FIG. 2c). Interestingly, flower-shaped structures which are difficult to obtain with other techniques are generated in a reproducible manner by taking advantage of the shrinkage of lightly crosslinked hydrogel structure in ethanol (FIG. 2d). The controlled porosity of such structures may be useful for applications such as size-based separations or to serve as flow-through stretching devices for DNA.

Figure 3A:
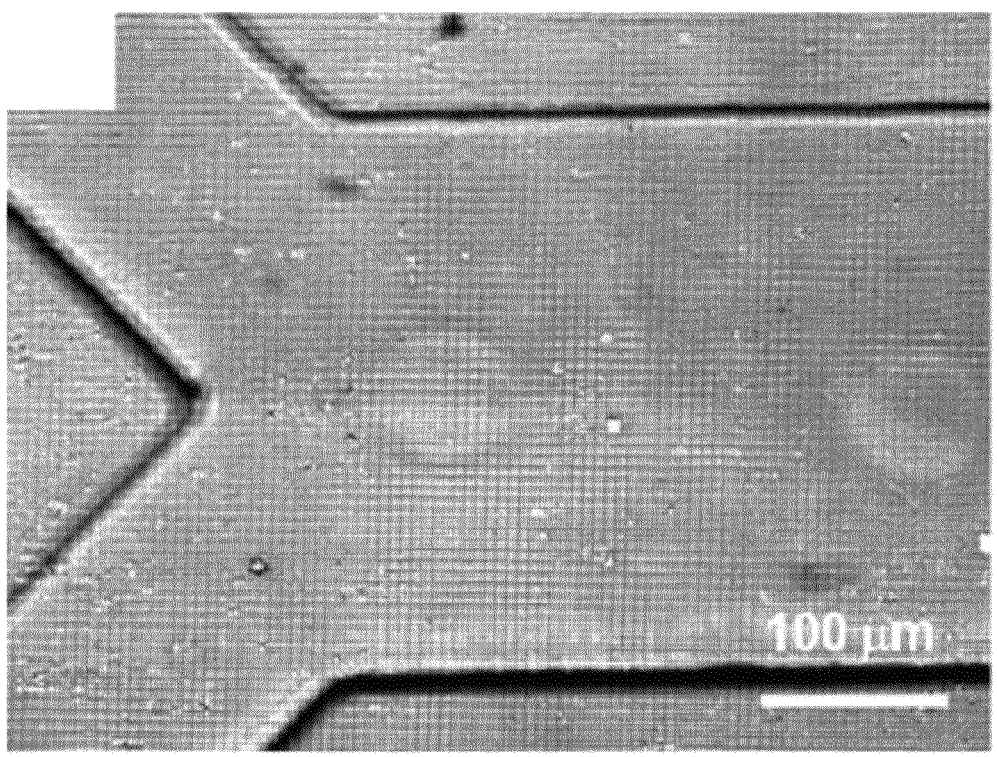
FIG. 3a is a DIC image of a microfluidic channel showing co-flow of rhodamine-labeled and non-labeled oligomer streams as well as faint images of circular prism regions after two stop flow exposures.
Figure 3B:
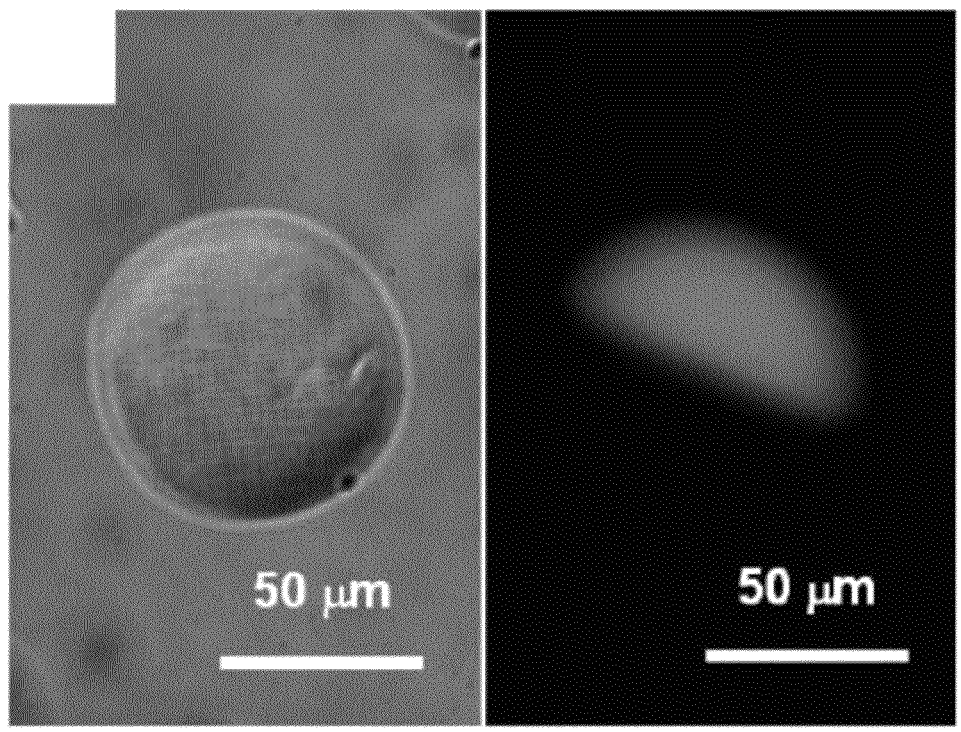
FIG. 3b is a DIC image (left) and fluorescence microscopy image (right) of a 3-dimensionally patterned Janus particle.

An important advantage of laminar flow in microfluidic devices is that it permits the creation of chemical anisotropy in flowing liquids. The flow can be homogenized only by the slow process of diffusive mixing since convective mixing is negligible at these length scales. Several applications of this chemical confinement phenomenon have been reported, including the synthesis of chemically inhomogeneous particles.[22,25] One unique advantage of combining IL with microfluidics is the ability to synthesize chemically inhomogeneous 3D structures. As an illustrative example, Janus particles with 3D patterns are synthesized by co-flowing parallel streams of two different monomers (PEGDA and rhodamine-labeled PEGDA) as shown in FIG. 3a. A brightfield image and a fluorescent image of a 75 μm diameter circular disk, only half of which has been labeled with a fluorescent dye, are shown in the left and right portions of FIG. 3b, respectively. One may finely tune the anisotropy of the structures formed by moving the position of the fluid-fluid interface relative to the light intensity pattern. It is also possible to synthesize structures bearing gradients in concentration or porosity using similar methods. In tissue engineering, such structures may be used to create a gradient of molecules on the surface of a biocompatible scaffold or localize growth factors to a specific region. This can influence cell adhesion and migration, providing functional cues to cells.[2]

Figure 4A:
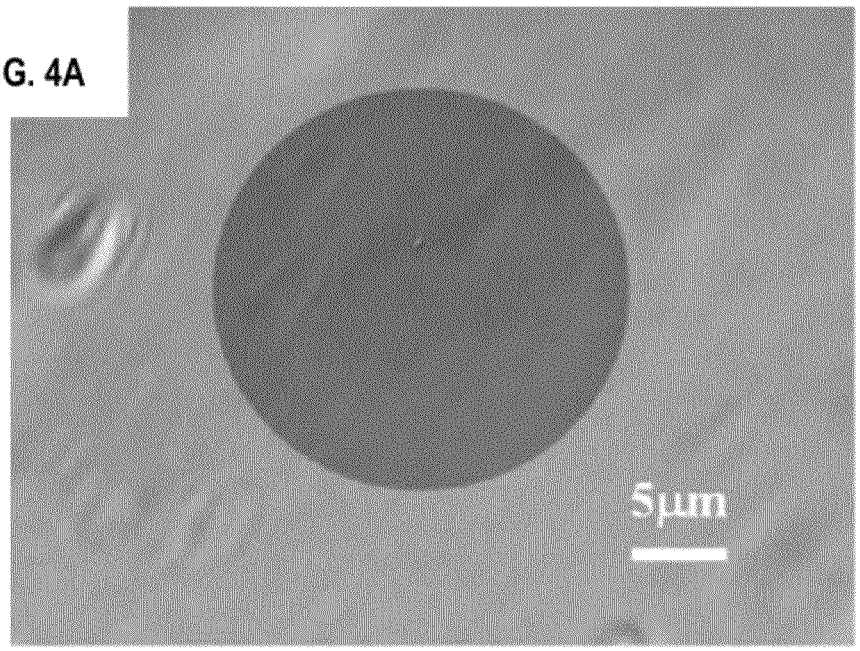
FIG. 4a is a brightfield optical image of a flat hydrogel structure formed without interference lithography.
Figure 4B:
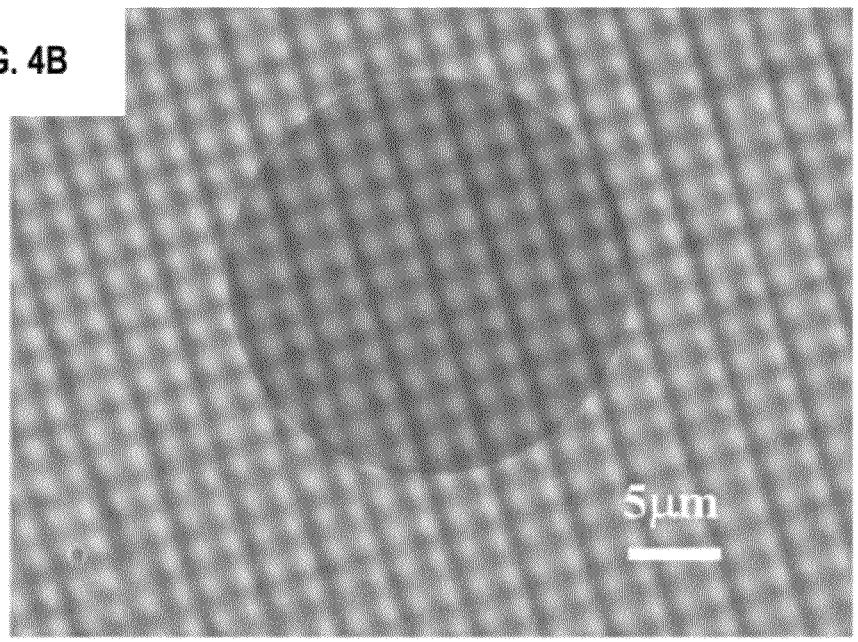
FIG. 4b is a brightfield image of a patterned structure formed using the system of the invention.

One of the most promising uses of polymeric particles is for sensing and diagnostic applications.[3] In such applications, a probe molecule on the surface of the particle first binds to a target fluorophore molecule in solution. The particles are then washed to remove unbound fluorescent target molecules. The presence of the target in the original solution can be inferred by reading the intensity of the fluorescent signal emanating from the surface of the particle. The sensitivity of such particle detection assays is critically dependent on the number of probe molecules that are present on the surface of the particle. Increasing the surface area of the particles by creating intricate patterned networks on the surface enables the synthesis of particles with extremely high surface area to volume ratios. We formed 500 µm diameter, 50 µm tall disk-shaped hydrogel particles containing probe DNA molecules (FIG. 4) using SFIL. FIG. 4a is a brightfield optical image of a flat hydrogel structure formed without interference lithography. FIG. 4b is a brightfield image of a patterned structure formed using the SFIL disclosed herein. FIG. 4c is an image of the region highlighted in FIG. 4a taken using a fluorescence microscope. The signal shown is very weak because of the low density of probe molecules on the surface of the particles. FIG. 4d is a fluorescent image of the structure seen in FIG. 4b and shows a high signal at the same conditions as seen in FIG. 4c because of the high density of probe molecules on the surface. In FIGS. 4c and 4d, the field stop aperture has been closed down to collect signal from a small circular portion of the structure corresponding to the highlighted region in FIGS. 4a and 4b, respectively.

These particles were then mixed with target DNA fluorophore molecules for hybridization and then washed to remove unbound target. We find that the use of SFIL permits a ten-fold increase in signal intensity compared to that observed with the control structure. In a regime where there is a great excess of target molecules compared to probe molecules, light intensity is assumed to vary linearly with probe density. Therefore, the surface area of the SFIL structures is inferred to be an order of magnitude greater than that of the control structures. This implies that biosensors with 3D patterns could be used to greatly increase the sensitivities in particle assays.

In some embodiments, projecting the shaped pulse of illumination comprises controlling illumination shape by a digital micromirror device. Thus, in these embodiments, the system includes a digital micromirror device configured to control shape of the collimated light. In some embodiments, projecting the shaped pulse of illumination comprises dynamically changing pulse shape during illumination. Thus, in such embodiments, the source of collimated light is configured to change shape of the collimated light dynamically while passing the collimated light through the phase mask.

In conclusion, we have shown that combining interference lithography with a flow through microfluidic device offers several advantages. By synthesizing structures in hydrogel polymers that are not usually amenable to spin-coating, we are able to expand the range of materials available to interference lithography. The use of SFIL permits the high throughput synthesis of mask-defined 3D structures whose length scales span three orders of magnitude (e.g. 1 µm-1000 µm). In addition, various 3D structures with different surface areas and morphologies could be generated from one phase mask by controlling the interference intensity distribution of light, as well as the concentration of an inhibitor. By adopting a stop-flow exposure scheme, particles with 3D structures at the sub-micron scale were generated in a high throughput fashion in a microfluidic device. A wide range of materials such as stimuli-responsive polymers, biocompatible polymers, polymer-nanoparticle composites, etc., can also be used for particle structure formation. By exploiting the diffusion-limited mixing seen in a microfluidic device, we have shown the synthesis of 3D structures that possess chemical anisotropy. Such structures may be used to provide optimal conditions for cell growth and viability in tissue engineering applications. It was also shown that the high surface area/volume ratio of the structures formed may be used to generate high fluorescent signal intensities that could be of benefit to a variety of sensing and diagnostic applications. SFIL could be used for the high throughput generation of 3-dimensionally patterned 2D structures to conduct cell-material assays in a multiplexed fashion or to fabricate large numbers of microtissue templates.[30] Optimizing the materials used could also result in the formation of 3D colloidal particles with submicron scale by disconnecting the structures after formation.[31] The technique can also be used to generate materials with anisotropic mechanical strength and porosity. These may find applications in guiding light, sound or mechanical energy. Channels with a non-rectangular cross-section can also be employed to create more complex shapes.

Experiments

Details of the fabrication of the PDMS phase mask, the microfluidic device and the stop-flow lithography setup are now described.

Fabrication of PDMS Phase Mask:

The patterned Si wafer served as the template for generating the phase mask. After exposing the wafer to perfluorinated trichlorosilane (Sigma Aldrich) vapor in a vacuum chamber for 1 hour, poly(dimethylsiloxane) (PDMS) (Sylgard 184, Dow-Corning) prepolymer was poured on top of the patterned Si wafer. Curing (75° C. for 2 h) the PDMS and peeling it away from the master yielded a conformable phase mask. The layout of the relief features is shown in the inset of FIG. 2a. In order to prevent undesirable infill of the phase mask by liquid monomer and in order to retain the refractive index contrast between air and phase mask, a thin PDMS layer is applied on top of the phase mask. The detailed process is: a 3 µm thick film of PDMS was prepared by spin-coating diluted PDMS prepolymer (prepolymer:hexane=1:4) on a pre-treated glass slide with Victawet (SPI supplies, 5 wt % Victawet solution in water) followed by curing at 75° C. for 2 hr. After oxygen plasma treatment for 1 min on both the phase mask and the PDMS thin layer, the PDMS thin layer is carefully laminated on top of the phase mask. The PDMS thin layer/phase mask composite is released from the glass substrate in 5 wt % NaOH solution in a day.

Microfluidic Device:

As shown in FIG. 1, the PDMS phase mask comprises the bottom wall of the microfluidic device. A microfluidic device whose height is 20-50 µm and width 400 µm-1000 µm comprises the top of the device. The PDMS devices were then plasma sealed to the phase mask after placing thin sacrificial layers of PDMS on the channel alone and on the region of the phase mask which sits right under the channel. This is to ensure that the oligomer was exposed only to non-plasma treated PDMS surfaces while ensuring that the device is still effectively sealed.

Stop-Flow-Lithography Setup:

Devices were mounted on an inverted microscope (Axiovert 200, Zeiss) and the formation of the structures was visualized using a CCD camera (KP-MIA, Hitachi). Flows in the microfluidic device are driven using a controlled pressure source. To generate controlled pressure in the range of 0-5 psi, a compressed air source (~40 psi) in the laboratory was first connected to a Type 100 LR manual pressure regulator (Control Air). Downstream of the regulator, a 3-way solenoid valve (Burkert) was used to switch rapidly between atmospheric pressure (stop) and the input pressure (flow). The output from the 3-way valve was connected to the microfluidic device using Tygon tubing connected to a 10 µl pipette tip (Biosciences). The pipette tip was filled with the desired fluid and inserted into the inlet hole punched in the microfluidic device. The transducer, 3-way valve and shutter were all controlled using VIs written in Labview 8.1 (National Instruments). The 3-way valve was controlled using a 1024-HLS digital I/O board (Measurement Computing) and a relay. The transducer and the shutter were controlled using serial connections.

Photopolymerization Setup—Hg Lamp:

A 100 W HBO mercury lamp with an i-line filter (Omega Optical) was used to provide 365.5 nm UV light. Light was collimated by passing the unfocused light (no objective in place) from the microscope through a 30 cm long, 1 cm diameter, hollow metallic tube that was blackened on the inside. Light intensity was measured to be 5 mW/cm$^2$. A VS25 shutter system (Uniblitz) driven by a computer controlled VMM-D1 shutter driver provided specified doses of UV light. Typical exposure times used were 500-1,000 ms. If required, photomasks (CAD Art Services, Bandor, Oreg.) were inserted into the field-stop of the microscope.

Photopolymerization—Laser:

The 3D structures were made using 1 wt % of Irgacure 819 (Sigma Aldrich) or Irgacure 184 initiator and 0.6-1.2 wt % of hydroquinone in poly(ethylene glycol) (400) diacrylate (PEGDA, Polysciences). 300-1,000 ms exposure with pulses of 160 fs from the frequency doubled output of a Ti:sapphire laser operating at 390 nm and a repetition rate of 250 kHz were used. The sample morphology was analyzed with SEM (JEOL 6060 and FESEM JSM-7401).

Oligonucleotide Incorporation:

For hybridization experiments, we used monomer solutions of 2:1 PEGDA:TE Buffer (10 mM Tris pH 8.0 (Rockland), 1 m MEDTA (OmniPur)) with 1% initiator and a DNA oligomer probe at a concentration of 50 μm. Oligomer probes (IDT) came modified with a reactive Acrydite group and 18-carbon spacer (Probe #1: 5Acrydite-C18 SEQ ID NO: 1: ATA GCA GAT CAG CAG CCA GA-3, Probe #2: 5 Acrydite-C18 SEQ ID NO: 2: CAC TAT GCG CAG GTT CTC AT-3).

Oligonucleotide Detection:

Particles were pipetted into separate PDMS reservoirs for each hybridization experiment. Complementary target DNA oligomers modified with a Cy3 fluorophore (IDT) were suspended at a concentration of 1 μM in hybridization buffer (TE buffer with 0.2M NaCl (Mallinckrodt) and 0.5% sodium dodecyl sulfate (SDS, Invitrogen)). Solutions of target oligomer were pipetted into the appropriate reservoirs and the particles were incubated for 10 min at room temperature. The particles were then rinsed several times with TE buffer and visualized using an orange longpass filter set (XF101-2, Omega), which is compatible with both rhodamine B and Cy3 fluorophores. Still images were captured using a Nikon D200 digital camera.

REFERENCES

[1] R. S. Kane, S. Takayama, E. Ostuni, D. E. Ingber, G. M. Whitesides, *Biomaterials.* 1999, 20, 2363.
[2] A. Khademhosseini, R. Langer, J. Borenstein, J. P. Vacanti, *Proc. Natl. Acad. Sci.* 2006, 103, 2480.
[3] C. Pregibon, M. Toner, P. S. Doyle, *Science* 2007, 315, 1393.
[4] Y. Lu, Y. D. Yin, Y. N. Xia, *Adv. Mater.* 2001, 13, 415.
[5] D. A. Parthenopoulos, P. M. Rentzepis, *Science* 1989, 245, 843.
[6] C. J. Bettinger, E. J. Weinberg, K. M. Kulig, J. P. Vacanti, Y. D. Wang, J. T. Borenstein, R. Langer, *Adv. Mater.* 2006, 18, 165.
[7] F. Gelain, D. Bottai, A. Vescovi, S. Zhang, *PLoS ONE* 2006, 1, e119.
[8] E. L. Thomas, D. B. Alward, D. J. Kinning, D. C. Martin, D. L. Handlin, L. J. Fetters, *Macromolecules;* 1986, 19, 2197.
[9] S. Zhang, *Proc. Natl. Acad. Sci.* 2003, 21, 1171.
[10] A. D. Dinsmore, A. C. Yodh, D. J. Pine, *Phys. Rev. E* 1995, 52, 4045.
[11] J. C. Galas, B. Belier, A. Aassime, J. Palomo, D. Bouville, J. Aubert, *J. Vac. Sci. Technol., B* 2004, 22, 1160.
[12] G. M. Gratson, M. J. Xu, J. A. Lewis, *Nature* 2004, 428, 386,
[13] S. Kawata, H. B. Sun, T. Tanaka, K. Takada, *Nature* 2001, 412, 697.
[14] J. H. Jang, C. K. Ullal, M. Maldovan, T. Gorishnyy, S. E. Kooi, C. Koh, E. L. Thomas, *Advanced Functional Materials* 2007, In Press.
[15] J. A. Rogers, K. E. Paul, R. J. Jackman, G. M. Whitesides, *J. Vac. Sci. Technol., B* 1998, 16, 59.
[16] J. H. Jang, C. K. Ullal, T. Gorishnyy, V. V. Tsukruk, E. L. Thomas, *Nano Lett.* 2006, 6, 740.
[17] S. Jeon, J. U. Park, R. Cirelli, S. Yang, C. E. Heitzman, P. V. Braun, P. J. A. Kenis, J. A. Rogers, *Proc. Natl. Acad. Sci,* 2004, 101, 12428.
[18] M. Campbell, D. N. Sharp, M. T. Harrison, R. G. Denning, A. J. Turberfield, *Nature* 2000, 404, 53.
[19] S. Yang, J. Ford, C. Ruengruglikit, Q. R. Huang, J. Aizenberg, *J. Mater. Chem.* 2005, 15, 4200.
[20] C. K. Ullal, M. Maldovan, E. L. Thomas, G. Chen, Y. J. Han, S. Yang, *Appl. Phys. Lett.* 2004, 84, 5434.
[21] S. C. Glotzer, M. J. Solomon, N. A. Kotov, *AIChE J.* 2004, 50, 2978.
[22] D. Dendukuri, D. C. Pregibon, J. Collins, T. A. Hatton, P. S. Doyle, *Nature Mater.* 2006, 5, 365.
[23] J. W. Kim, A. S. Utada, A. Fernandez-Nieves, Z. B. Hu, D. A. Weitz, *Angew. Chem., Int. Ed.* 2007, 46, 1819.
[24] D. Dendukuri, S. S. Gu, D. C. Pregibon, T. A. Hatton, P. S. Doyle, *Lap Chip* 2007, 7, 818.
[25] D. Dendukuri, T. A. Hatton, P. S. Doyle, *Langmuir* 2007, 23, 4669.
[26] C. Decker, A. D. Jenkins, *Macromolecules* 1985, 18, 1241.
[27] H. A. Stone, A. D. Stroock, A. Ajdari, *Annual Review of Fluid Mechanics* 2004, 36, 381.
[28] S. Yang, M. Megens, J. Aizenberg, P. Wiltzius, P. M. Chaikin, W. B. Russel, *Chem. Mater.* 2002, 14, 2831.
[29] Since there is a residual non-zero background of the interference intensity and the registry of the interference pattern occurs simultaneously with photocrosslinking, we find that the structures do not yet show fully open 3D pores throughout. Further optimization of the hydrogel materials and the phase mask should enable high porosity hydrogel/ air bicontinuous structures to be achieved.
[30] M. C. Cushing, K. S. Anseth, *Science* 2007, 316, 1133.
[31] J. H. Jang, C. K. Ullal, S. E. Kooi, C. Koh, E. L. Thomas, *Nano Lett.* 2007, 7, 647.

What is claimed is:

1. Stop flow interference lithography system for high throughput synthesis of 3-dimensionally patterned polymeric particles comprising:
    a microfluidic channel configured to hold a stationary oligomer;
    a phase mask located adjacent to the microfluidic channel; and
    a source of collimated light for passing the collimated light through the phase mask and into the microfluidic channel for interaction with the oligomer, the passage of the collimated light through the phase mask generating a 3-dimensional distribution of light intensity to induce crosslinking of the oligomer in high intensity regions thereby forming 3-dimensional structures.

2. The system of claim 1 wherein the light source comprises a pulsed laser.

3. The system of claim 2 further including a shutter for regulating light from the light source.

4. The system of claim 1 wherein the light source comprises a mercury lamp.

5. The system of claim 1 further including a mask for transmitting light from the light source to define the 2-dimensional shape of the particles.

6. The system of claim 5 wherein the mask comprises a lithographic mask.

7. The system of claim 5 wherein the mask comprises a transparency mask.

8. The system of claim 5 wherein the mask comprises a chrome mask.

9. The system of claim 5 wherein the mask comprises a gray-scale mask.

10. The system of claim 1 wherein the oligomer includes a photoinitiator.

11. The system of claim 1 further including a protective layer between the phase mask and the liquid oligomer.

12. The system of claim 1 further including a radical inhibitor in the oligomer.

13. The system of claim 1 wherein the particles possess chemical anisotropy.

14. The system of claim 1 wherein the microchannel has a non-rectangular cross-section.

15. The system of claim 1 wherein the oligomer solution contains cells, viruses, proteins, nanoparticles, microparticles or other small entities.

16. The system of claim 1 wherein the oligomer solution contains a porogen.

17. The system of claim 1 wherein the high intensity regions polymerize the microstructure by thermal polymerization.

18. The system of claim 1 further comprising a digital micromirror device configured to control shape of the collimated light.

19. The system of claim 1 wherein the source of collimated light is configured to change shape of the collimated light dynamically while passing the collimated light through the phase mask.

20. A method for high throughput synthesis of 3-dimensionally patterned polymeric particle comprising:
    causing an oligomer to become stationary in the microfluidic channel of the stop flow interference lithography system of claim 1; and
    generating a 3-dimensional distribution of light intensity in the microfluidic channel to induce crosslinking of the oligomer in high intensity regions of the 3-dimensional distribution in the microfluidic channel thereby forming a 3-dimensional structure.

* * * * *